(12) United States Patent
Kametani et al.

(10) Patent No.: US 7,829,865 B2
(45) Date of Patent: Nov. 9, 2010

(54) ELECTROSTATIC DEFLECTOR

(75) Inventors: Takashi Kametani, Tokyo (JP); Masahiro Inoue, Tokyo (JP)

(73) Assignee: Topcon Corporation, Tokyo (JP)

( * ) Notice: Subject to any disclaimer, the term of this patent is extended or adjusted under 35 U.S.C. 154(b) by 301 days.

(21) Appl. No.: 12/216,371

(22) Filed: Jul. 2, 2008

(65) Prior Publication Data

US 2009/0140161 A1 Jun. 4, 2009

Related U.S. Application Data

(62) Division of application No. 11/430,195, filed on May 9, 2006, now Pat. No. 7,435,969.

(30) Foreign Application Priority Data

Sep. 30, 2005 (JP) .............................. 2005-286918

(51) Int. Cl.
  *H01J 49/00* (2006.01)
  *G21K 1/08* (2006.01)
(52) U.S. Cl. .................... 250/396 R; 250/397; 250/398
(58) Field of Classification Search ............. 250/396 R, 250/397
See application file for complete search history.

(56) References Cited

U.S. PATENT DOCUMENTS

| | | | | |
|---|---|---|---|---|
| 4,200,794 A | | 4/1980 | Newberry et al. ..... 250/396 ML |
| 4,542,293 A | * | 9/1985 | Fenn et al. ................... 250/288 |
| 4,769,542 A | | 9/1988 | Rockett ...................... 250/305 |
| 5,731,586 A | * | 3/1998 | Takashima ........... 250/396 ML |
| 6,107,633 A | * | 8/2000 | Frosien et al. ........ 250/396 ML |
| 6,380,546 B1 | * | 4/2002 | Petrov et al. ............ 250/396 R |
| 6,664,544 B1 | * | 12/2003 | Marui et al. .......... 250/396 ML |
| 6,855,938 B2 | * | 2/2005 | Preikszas et al. ........ 250/396 R |
| 6,891,167 B2 | * | 5/2005 | Notte, IV ............. 250/396 ML |
| 7,435,969 B2 | * | 10/2008 | Kametani et al. ....... 250/396 R |
| 7,652,263 B2 | * | 1/2010 | Feuerbaum ............. 250/396 R |
| 7,700,930 B2 | * | 4/2010 | Buis et al. ................. 250/492.2 |
| 2007/0176114 A1 | * | 8/2007 | Horsky et al. ............... 250/427 |

* cited by examiner

*Primary Examiner*—David A Vanore
(74) *Attorney, Agent, or Firm*—Kubovcik & Kubovcik

(57) ABSTRACT

An electrostatic deflector that can be manufactured easily and very accurately without using a member for positioning is provided. After multiple slits 81*d* to 88*d* have been formed in the same direction as that of the bus bar of an approximately conical electrode material 100 whose large-diameter section is formed with flange portions 81*a* to 88*a* for installation on an insulator 90, each of the flange portions is coupled with the insulator 90, then the electrode material 100 is cut along extension lines of the slits 81*d* to 88*d*, and thus, multiple electrode members electrically isolated from one another are formed.

8 Claims, 7 Drawing Sheets

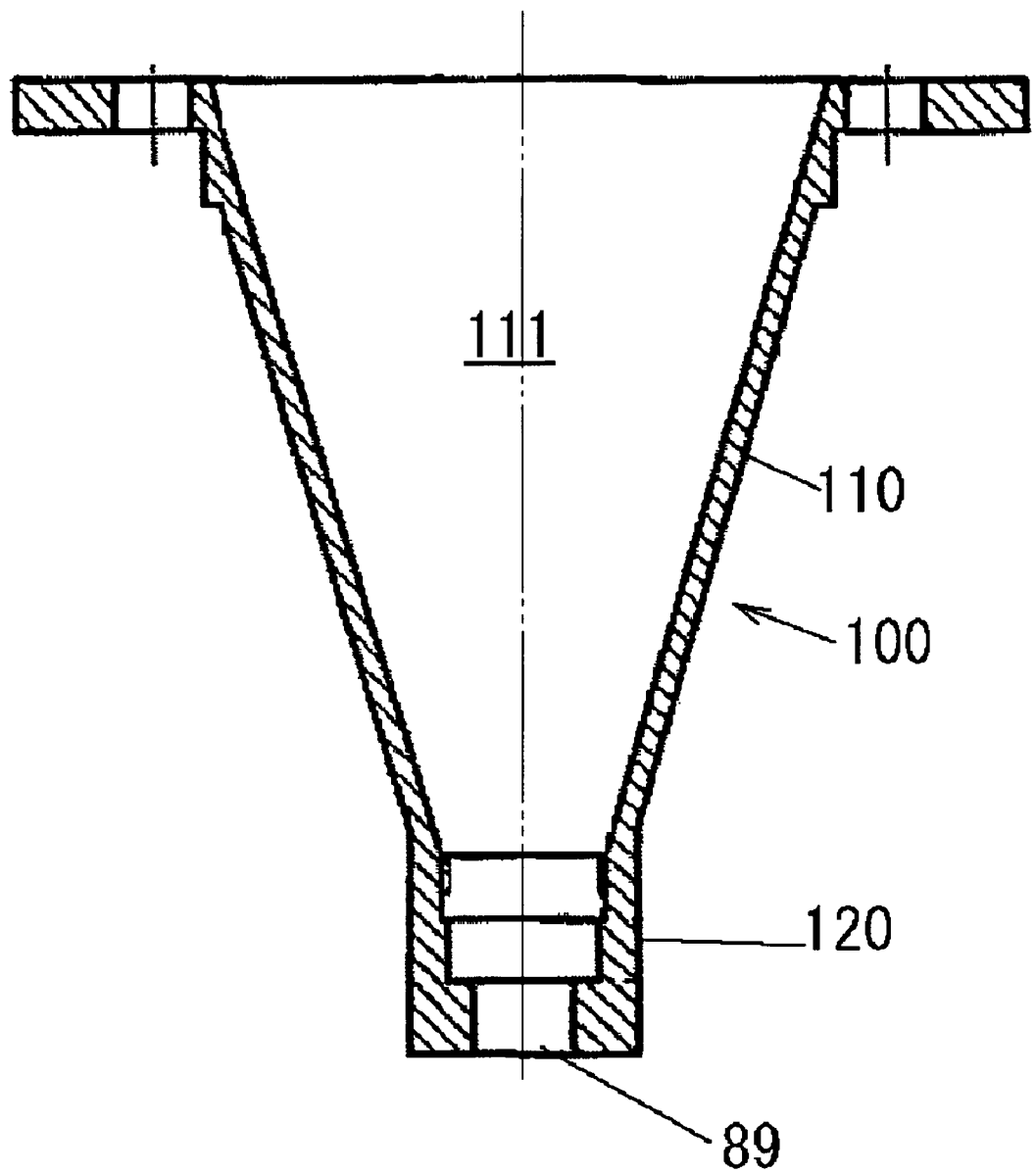

ELECTROSTATIC DEFLECTOR

This application is a division of U.S. patent application Ser. No. 11/430,195 filed May 9, 2006, now U.S. Pat. No. 7,435,969 and claims priority of Japanese patent application No. 2005-286918 filed Sep. 30, 2005, each of which is incorporated herein by reference.

BACKGROUND OF THE INVENTION

The present invention relates generally to deflectors for deflecting electron beams, ion beams, and other electrically charged beams. More specifically, the invention relates to an electrostatic deflector for use in electron beam exposure apparatuses, ion implantation apparatuses, electron microscopes, and the like.

Some of traditionally known deflectors are outlined below. Japanese Patent Laid-open No. 2-100250 describes an electrostatic deflector having four sector-form electrodes arranged, with rod-shaped structures as their supporting columns, inside a cylindrical insulator. Also, Japanese Patent Laid-open No. 8-171881 describes an electrostatic deflector constructed by machining eight split electrode pieces integrally into flange form and mounting these electrode pieces in or on an electrode supporter.

In addition, Japanese Patent Laid-open No. 4-174510 describes a method of manufacturing an electrostatic deflector for an electron beam exposure apparatus. The method described in Japanese Patent Laid-open No. 4-174510 includes the steps of: bonding a cylinder formed of an electrode material, onto the inner surface of a cylinder formed of an insulator; cutting the cylinder formed of the electrode material, into a plurality of segments in the axial direction of the cylinder so that the cylinder formed of the insulator is invisible from the path of an electron beam; and using the remaining cut pieces as electrode pieces.

Furthermore, Japanese Patent Laid-open No. 2-123651 describes a method of manufacturing an electrostatic deflection electrode having the required number of pole pieces. In the method described in Japanese Patent Laid-open No. 2-123651, after an integrated first component constructed of an electroconductive semiconductor or metal and having a hollow symmetrical shape has been readied for use, a second component constructed of an insulator is embedded in the outer surface or inner surface of the first component, then a plurality of slits each extending from one end of the first component to the other end thereof and terminating at the second component are formed to segment the first component at the slits.

Moreover, Japanese Patent Laid-open No. 10-261376 describes a method of manufacturing an electrostatic deflection electrode for an electron beam lithography apparatus. The method described in Japanese Patent Laid-open No. 10-261376 includes: a first step of obtaining a cylindrical material formed of an electroconductive metallic; a second step of providing slits of a required width in the cylindrical material, each of the slits extending from the top of an independent line for sectioning the outer peripheral surface of the cylindrical material circumferentially into eight equal segments, to a radial halfway position on the cylindrical material in the direction of its axial center line; a third step of securing an independent, ring-shaped insulating jig internally to each of the regions provided with the slits at both edges of the cylindrical material in the direction of its axial center line; and a fourth step of extending the inner end side of each slit in the direction of the axial center line under the conditions where the ring-shaped jigs are mounted, and separating the cylindrical material circumferentially into eight electrode elements.

Besides, Japanese Patent Laid-open No. 5-29201 describes a method of manufacturing an electrostatic deflection electrode in the manner below. A plurality of outer insulating grooves each extending from the side face of a block towards an electron beam passage region are formed, then an independent insulator is fittingly inserted into each outer insulating groove and bonded onto the inner wall thereof, and a plurality of intermediate insulating grooves are formed. This causes the outer insulating grooves to communicate with associated inner insulating grooves and thus forms a plurality of electrodes each surrounding the electron beam passage region.

Such an electrostatic deflector as described in Japanese Patent Laid-open No. 2-100250, however, has a problem in that since four sector-form electrodes must be arranged with rod-shaped structures as their supporting columns inside a cylindrical insulator, too great a deal of working labor is required for efficient manufacture of the electrostatic deflector. Also, such electrostatic deflectors as described in Japanese Patent Laid-open Nos. 8-171881, 4-174510, 2-123651, and 10-261376 have a problem in that since electrodes must be mounted in or on an electrode supporter by means of bonding or the like, a great deal of working labor is required and the electrodes are extremely difficult to arrange in equally spaced form with respect to an electron beam so as not to cause a disturbance of a magnetic field and so as not to bring the electrodes into contact with one another. In addition, such an electrostatic deflector as described in Japanese Patent No. 5-29201, however, has a problem in that since independent insulators are fittingly inserted into outer insulating grooves and then bonded onto the inner walls thereof, too great a deal of working labor is required for efficient manufacture of the electrostatic deflector.

An object of the present invention is therefore to provide an electrostatic deflector that can be manufactured easily, efficiently, and very accurately, without using a member for positioning.

SUMMARY OF THE INVENTION

In an electrostatic deflector manufacturing method and electrostatic deflector according to the present invention, an electrode material formed with slits is connected to an insulator and then the electrode material is cut along the slits, whereby a plurality of electrode members are constructed.

More specifically, the method of manufacturing an electrostatic deflector according to the present invention includes: forming a plurality of slits in an essentially conical electrode material to extend in the same direction as that of a bus bar of the electrode material, which has a large-diameter section formed with a flange section for installation on an insulator; and coupling the flange section with the insulator, and then cutting the electrode material to communicate with the slits for manufacture of an integrated electrode formed up of a plurality of electrode members electrically isolated from one another.

Also, the electrostatic deflector according to the present invention is outlined below. The electrostatic deflector includes a plurality of electrode members arranged to put slits, extending along a bus bar, therebetween and to be formed into an essentially conical shape. The electrode members are installed on an insulator through a flange portion formed on a large-diameter side of the electrode members. Inn addition, the electrode members are manufactured by forming a plurality of slits in an essentially conical electrode material to extend in the same direction as that of a bus bar of the electrode material, coupling the flange section with the insulator, and then cutting the electrode material along extension lines of the slits for electrical isolation.

The slits in the electrode material may be continuously formed spanning from the flange section to the conical section. The electrode material of the approximately conical shape can also be cut from a small-diameter section thereof. Additionally, electrical discharge machining can be employed to perform the above cutting operations. Furthermore, each of the electrode members can be an approximately conical member with required thickness.

In the present invention, therefore, first assembling the electrode material into an insulating member integrally without separating the electrode material into each electrode member and by forming slits therein, and then splitting the electrode material allows an electrostatic deflector to be manufactured easily and very accurately without using a member for positioning the electrostatic deflector.

BRIEF DESCRIPTION OF THE DRAWINGS

FIG. 6 is a sectional view of an electrode material of the electrostatic deflector shown in FIG. 2.

DETAILED DESCRIPTION OF THE INVENTION

Figure 1:
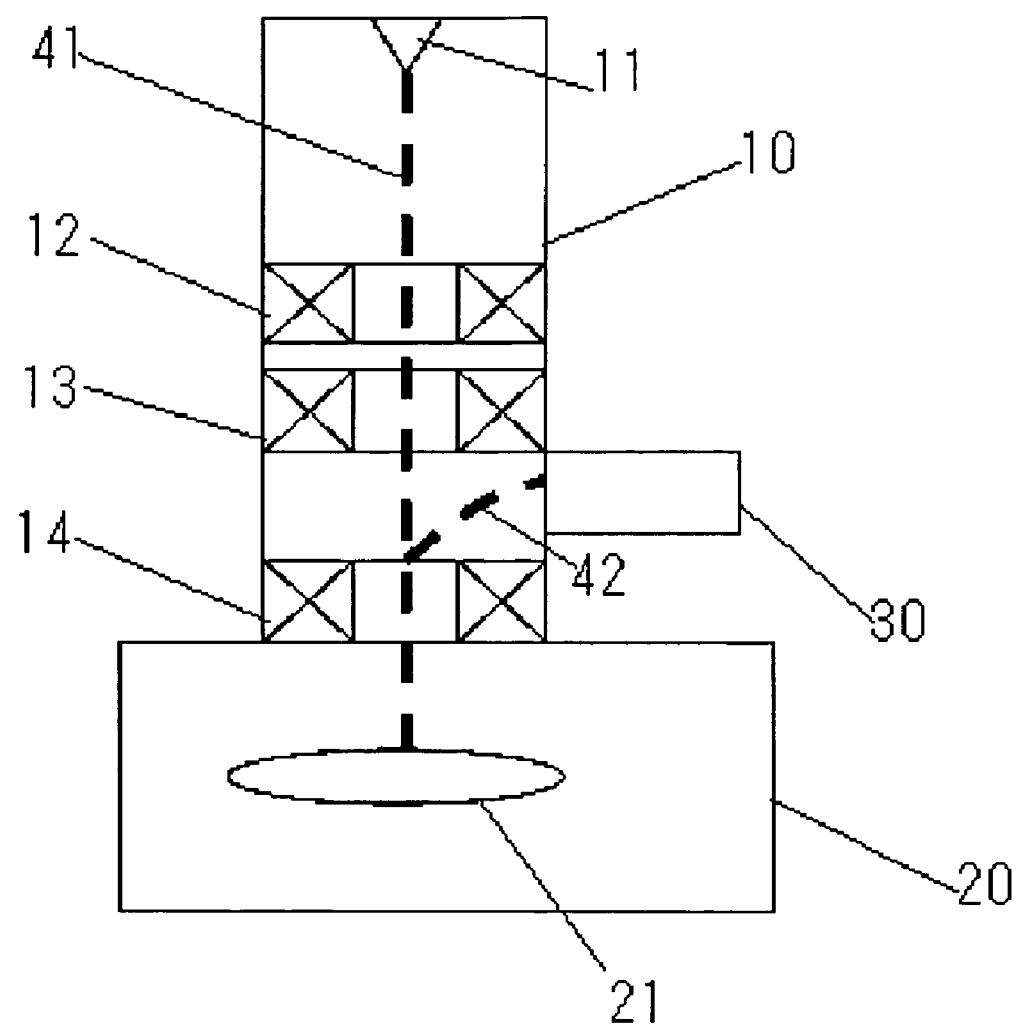
FIG. 1 is a diagram showing a schematic construction of a scanning electron microscope that uses an electrostatic deflector according to an embodiment of the present invention.

A method of manufacturing an electrostatic deflector according to an embodiment of the present invention will be described below. The electrostatic deflector according to the invention is used in, for example, the scanning electron microscope shown in FIG. 1. This scanning electron microscope, after generating an electron beam 41 from an electron beam generator 11 provided in an upper section of a lens barrel 10, first deflects the electron beam via alignment coils 12 (a first deflector) and stigmatic coils 13 (a second deflector). Next, the scanning electron microscope adjusts a magnification using objective lens coils 14 (a magnification controller), and scans a sample 21. After this, the scanning electron microscope activates a detector 30 to detect an electrically charged particle 42 generated from the sample 21, such as a secondary electron or backscattered electron, and displays an image of the sample at an image display device not shown, such as a monitor. The image of the sample can thus be viewed.

Figure 2:
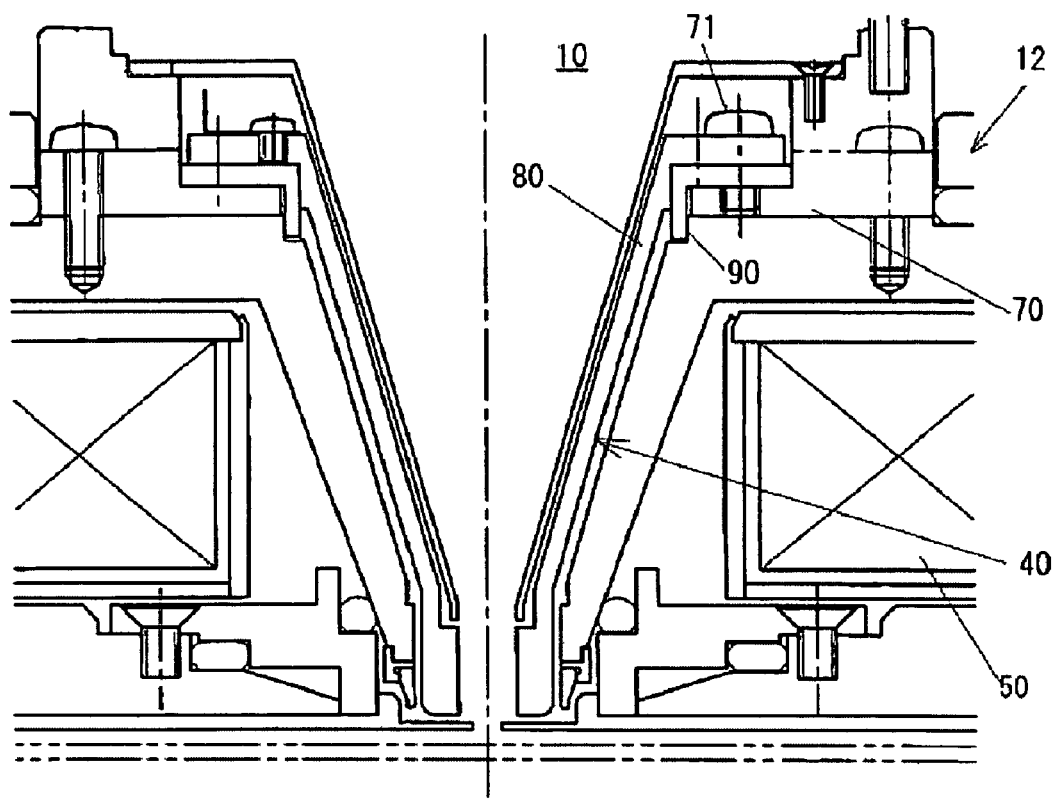
FIG. 2 is a sectional view showing installation of the electrostatic deflector of FIG. 1 in a scanning electron microscope.

A detailed structure of this electrostatic deflector is shown in FIG. 2. In the present embodiment, inside the lens barrel 10, the electrostatic deflector 40 according to the embodiment is disposed spanning from a position internal to objective lens coils 50 equivalent to the objective lens coils 40 shown in enlarged view, to a position above the objective lens coils 50. In the present embodiment, electrodes 80 of the electrostatic deflector 40 are each attached to an annular installation member 70 with a screw 71, with an annular insulator 90 sandwiched between the electrode 80 and the annular installation member 70.

Figure 3:
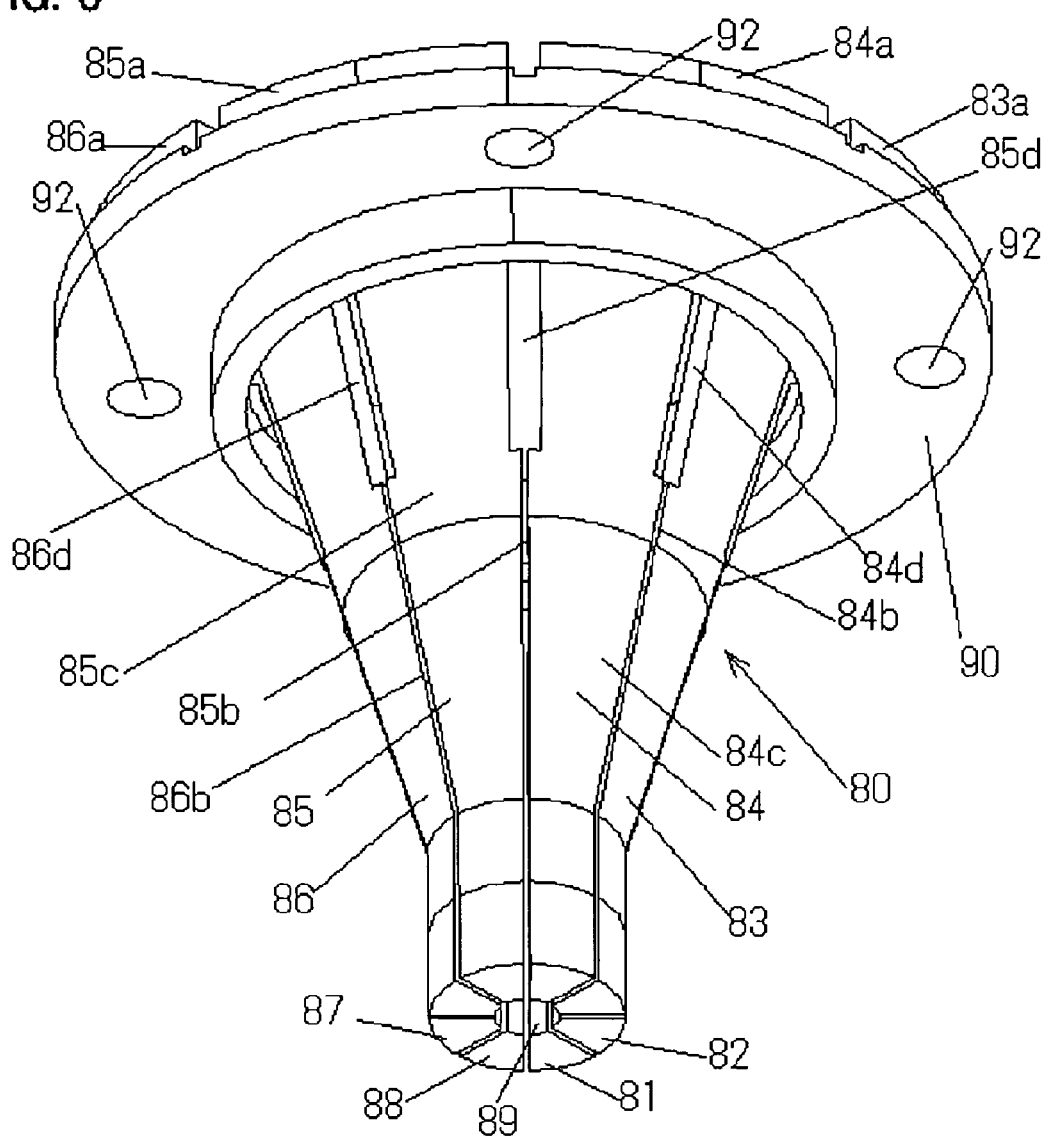
FIG. 3 is a perspective view of the electrostatic deflector of FIG. 2 as viewed from below.
Figure 4:
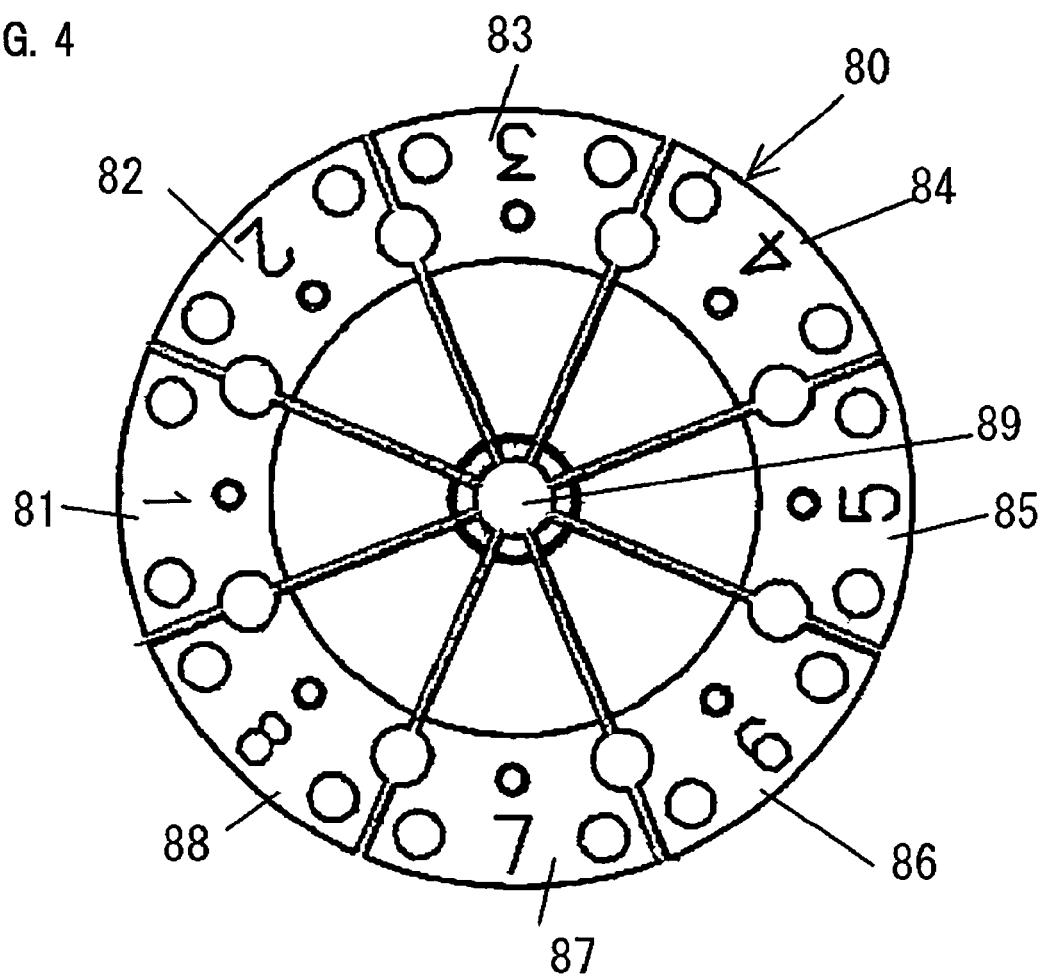
FIG. 4 is a plan view of the electrostatic deflector shown in FIG. 2.

As shown in FIGS. 2 to 4, each electrode 80 in the present embodiment is constructed of eight electrode members 81 to 88, and the electrode 80 has its entirety tapered as it goes downward, and is installed so as to form a conical shape having an electron beam penetration hole 89 at a front end. FIG. 4 is a view looking from installation flange portions 81a to 88a of FIG. 3. In the present embodiment, the eight electrode members 81 to 88 are of the same shape and as shown in FIG. 4, each of the members is formed symmetrical to an optical axis O and has a clearance 81b to 88b. Also, the flange portion 81a to 88a for installation through the insulator 90 is formed on a large-diameter side of each electrode member 81 to 88 of the conical shape, and the electrode member 81 to 88 provided extending downward from the flange portion 81a to 88a, along the conical shape. In addition, a slit 81d to 88d contiguous to the clearance 81b to 88b is formed spanning from the installation flange portion 81a to 88a to an electrode portion 81c to 88c. In the present embodiment, the installation flange portion 81a to 88a is installed on the insulator 90 by metallization.

Next, a method of manufacturing the electrostatic deflector according to the present embodiment is described below. The electrostatic deflector 40 according to the present embodiment is manufactured by assembling into the insulator 90 an electrode material 100 which is an integrated body of the electrode members 81 to 88 and the installation flange portions 81a to 88a, and then cutting the electrode material 100 by electrical discharge machining.

Figure 5:
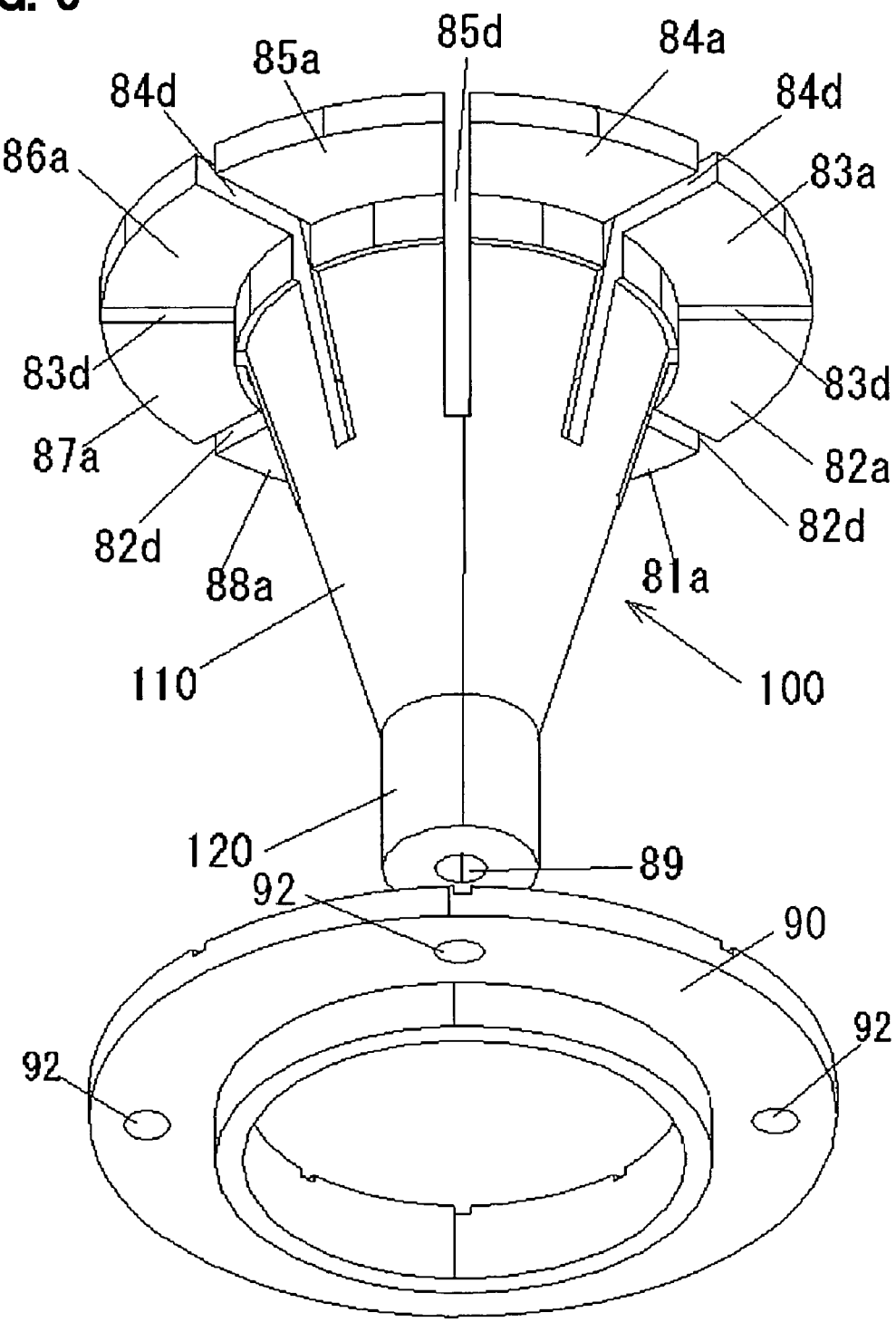
FIG. 5 is a perspective view showing the electrostatic deflector of FIG. 2 as viewed from below to describe its manufacturing process steps.

In the present embodiment, the electrode material 100 includes, as shown in FIGS. 5 and 6, eight installation flange portions 81a to 88a, a conical section 110 suspended in downward tapered form from a lower position of the installation flange portions 81a to 88a, and a cylindrical section 120 provided at a front end of the conical section 110. The electrode material 100 in the present embodiment is a metallic member and forms a spatial portion 111 inside the conical section 110, and the spatial portion 111 communicates with the electron beam penetration hole 89.

Between the installation flange portions 81a to 88a in the present embodiment are also formed the slits 81d to 88d, each of which extends to a required section below, along a bus bar of the conical section 110.

Figure 7A:
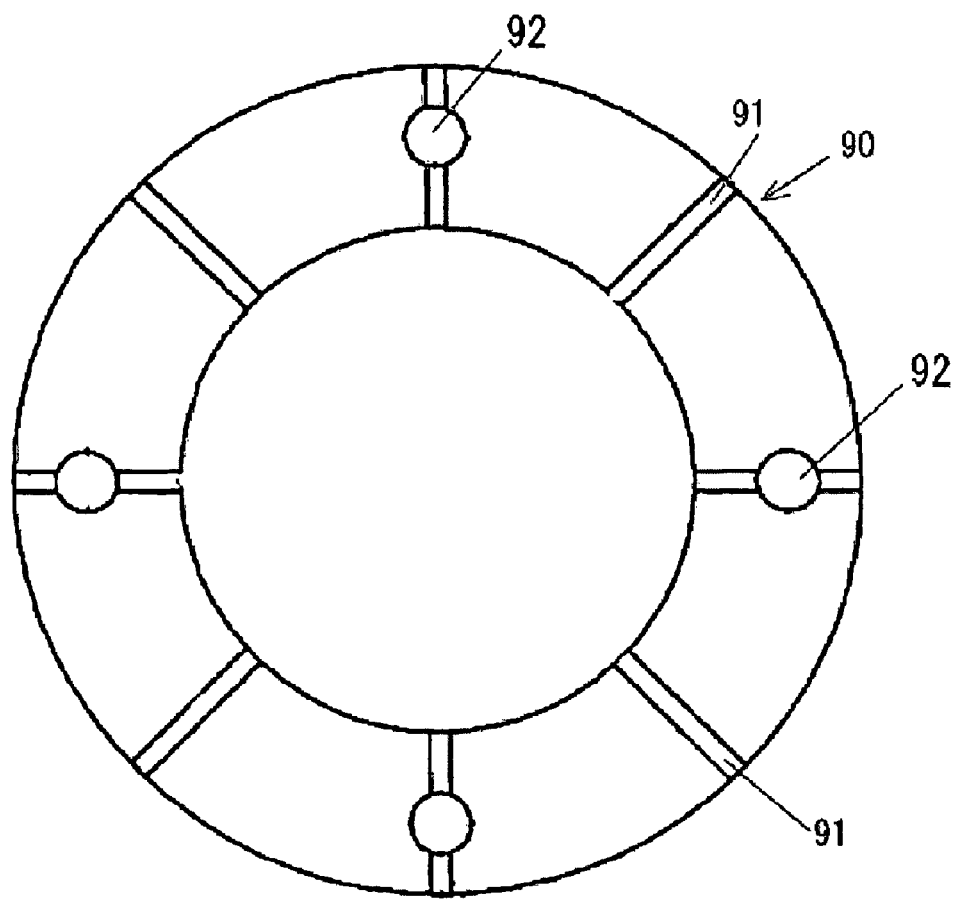
FIGS. 7A and 7B are a plan view and a front view, respectively, showing an installation member for the electrostatic deflector of FIG. 2.
Figure 7B:
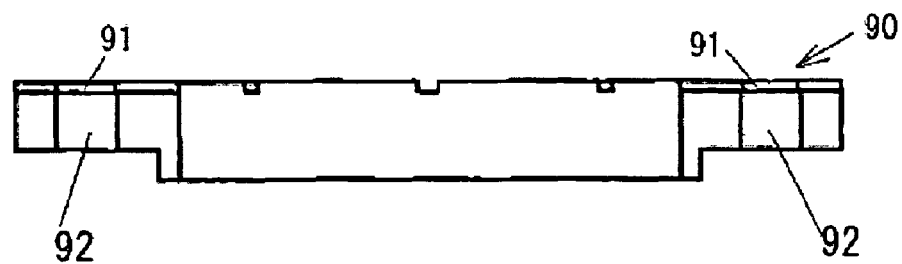

The insulator 90 is an annular member as shown in FIGS. 7A and 7B, and is formed with grooves 91 on its connection surfaces with respect to the installation flange portions 81a to 88a. Respective installation positions are set to achieve engagement with the above-mentioned slits 81d to 88d. In addition, through-holes 92 adapted for bolt insertion into the installation member 70 are provided in required portions of the insulator 90.

Next, a description is given of manufacturing steps for the electrostatic deflector according to the present embodiment. First, the installation flange portions 81a to 88a of the electrode material 100 are installed on the insulator 90 by metallization. The insulator 90 can be of a material such as ceramics or resin. Also, an adhesive can be used to couple the insulator 90 with the installation flange portions 81a to 88a.

After coupling between the electrode material 100 and the insulator 90, the electrode material 100 is divided into eight equal segments. This is accomplished by cutting the electrode material 100 from the cylindrical section 120 thereof, along the cylindrical section 120 and the bus bar of the conical section 110, by use of electrical discharge machining. The clearances 81b to 88b are formed as a result of the cutting operations. The clearances 81b to 88b are thus formed so that they lead to the slits 81d to 88d.

In the method of manufacturing the electrostatic deflector according to the present embodiment, since each electrode member 81 is formed by cutting the electrode material 100 with each installation flange portion 81a to 88a and the insulator 90 remaining coupled with one another, a member for positioning is unnecessary and none of the electrode members requires assembly labor, either. The electrostatic deflector can therefore be manufactured easily and accurately.

The electrostatic deflector manufactured is mounted in a required disposition section of an electron beam apparatus such as an electron beam exposure apparatus, ion implantation apparatus, or electron microscope.

An insulator charge-up preventing component can also be installed internally to the disposition section in which the electrostatic deflector manufactured is mounted. In that case, since charge-up of the insulator can be prevented, this electrostatic deflector, unlike conventional types, makes it possible to avoid increasing the number of components required and complicating the shape of the electrodes.

While an electrostatic deflector divided into eight equal segments has been described in the above embodiment, the deflector is not limited to such a structure and may be equally divided into a plurality of segments, such as two, three, or four segments. Also, the shape of the flange of the electrodes and the shape of the slits and clearances provided in the conical structure are not limited to a linear form and can be, for example, a zigzag form. Forming these sections into a zigzag shape makes it possible to prevent charge-up of the insulator, since the electron beam emitted is directly invisible from the insulator.

What is claimed is:

1. An electrostatic deflector,
   wherein the electrostatic deflector includes a plurality of electrode members arranged to put slits, extending along a bus bar, therebetween and to be formed into an essentially conical shape, and
   the electrode members are installed on an insulator through a flange portion formed on a large-diameter side of the electrode members; and
   wherein the electrode members are manufactured by forming a plurality of slits in an essentially conical electrode material to extend in the same direction as that of a bus bar of the electrode material, coupling the flange section with the insulator, and then cutting the electrode material along extension lines of the slits for electrical isolation.

2. The electrostatic deflector according to claim 1, wherein the slits in the electrode material are continuously formed spanning from the flange section to a conical section.

3. The electrostatic deflector according to claim 1, wherein the electrode material is an essentially conical, tubular member with required thickness.

4. The electrostatic deflector according to claim 2, wherein the cutting of the conical electrode material is started from a small-diameter section thereof.

5. The electrostatic deflector according to claim 2, wherein the electrode material is an essentially conical, tubular member with required thickness.

6. The electrostatic deflector according to claim 4, wherein the cutting is executed by electrical discharge machining.

7. The electrostatic deflector according to claim 4, wherein the electrode material is an essentially conical, tubular member with required thickness.

8. The electrostatic deflector according to claim 6, wherein the electrode material is an essentially conical, tubular member with required thickness.

* * * * *